(12) United States Patent
Campbell et al.

(10) Patent No.: US 10,168,356 B2
(45) Date of Patent: Jan. 1, 2019

(54) TEST AND MEASUREMENT PROBE WITH ADJUSTABLE TEST POINT CONTACT

(71) Applicant: Tektronix, Inc., Beaverton, OR (US)

(72) Inventors: Julie A. Campbell, Beaverton, OR (US); William A. Hagerup, Portland, OR (US); Ira G. Pollock, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 457 days.

(21) Appl. No.: 14/830,339

(22) Filed: Aug. 19, 2015

(65) Prior Publication Data
US 2017/0052216 A1    Feb. 23, 2017

(51) Int. Cl.
*G01R 1/067*     (2006.01)

(52) U.S. Cl.
CPC ..... *G01R 1/06705* (2013.01); *G01R 1/06722* (2013.01); *G01R 1/06738* (2013.01); *G01R 1/06788* (2013.01); *G01R 1/06772* (2013.01); *H01R 2201/20* (2013.01)

(58) Field of Classification Search
CPC ............ G01R 1/06705; G01R 1/06722; G01R 1/06738; G01R 1/06788
See application file for complete search history.

(56) References Cited

U.S. PATENT DOCUMENTS

| 5,672,964 | A  | 9/1997 | Vinci |
| 7,262,614 | B1 | 8/2007 | Campbell |

| 2007/0229099 | A1* | 10/2007 | Campbell | G01R 1/06755 |
| | | | | 324/755.01 |
| 2009/0212938 | A1* | 8/2009 | Swaim | G01R 1/06788 |
| | | | | 340/539.1 |
| 2017/0035526 | A1* | 2/2017 | Farritor | A61B 90/361 |

FOREIGN PATENT DOCUMENTS

| CN | 201532401 | 7/2010 |
| JP | H0247554 | 2/1990 |

OTHER PUBLICATIONS

Robot Gripper 3D Model, Sep. 22, 2014, animated 3D model available at https://www.youtube.com/watch?v=VHp0cNOvbKw.*
Extended European Search Report and Opinion for European Patent Application EP16185013.6, dated Feb. 3, 2017, 18 pages, EPO, Munich, Germany.
Tektronix, Inc., "Precision Differential Probing Module" (P75PDPM), Tri-Mode Probe Family P7500 Series Data Sheet (51W202717.pdf), Dec. 9, 2009, pp. 1, 4-5, 8, www.tektronix.com, Beaverton, OR, USA.

* cited by examiner

*Primary Examiner* — Daniel Miller
(74) *Attorney, Agent, or Firm* — Andrew J. Harrington

(57) ABSTRACT

A probe for making electrical contact with a device-under-test test point includes a body, a rigid member capable of travelling linearly with respect to the body, a flexible arm having a test point contact at one end and fastened to the rigid member at the other end, and a flexible linkage fixed to the body and to the flexible arm. The flexible linkage is structured to cause the flexible arm to bend in response to travel of the rigid member in one direction, and to cause the flexible arm to unbend in response to travel of the rigid member in the other direction. A second flexible arm may be included, the two arms opening and closing to change the distance between test point contacts. A light source may be disposed on a portion of the flexible linkage that simultaneously articulates to automatically track the orientation of the test point contact.

13 Claims, 7 Drawing Sheets

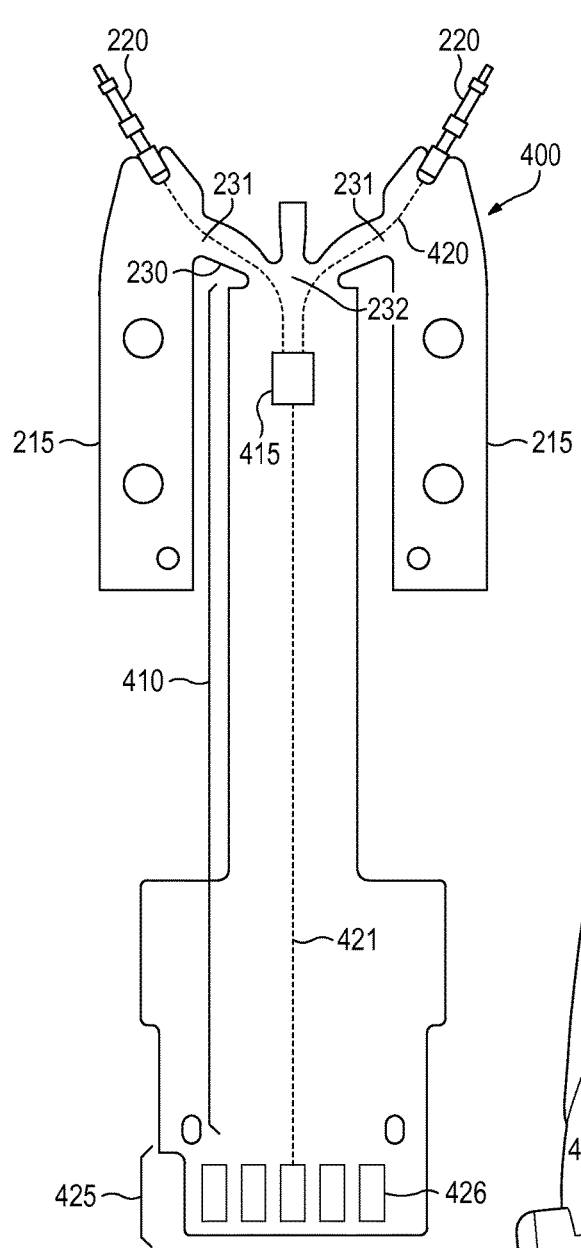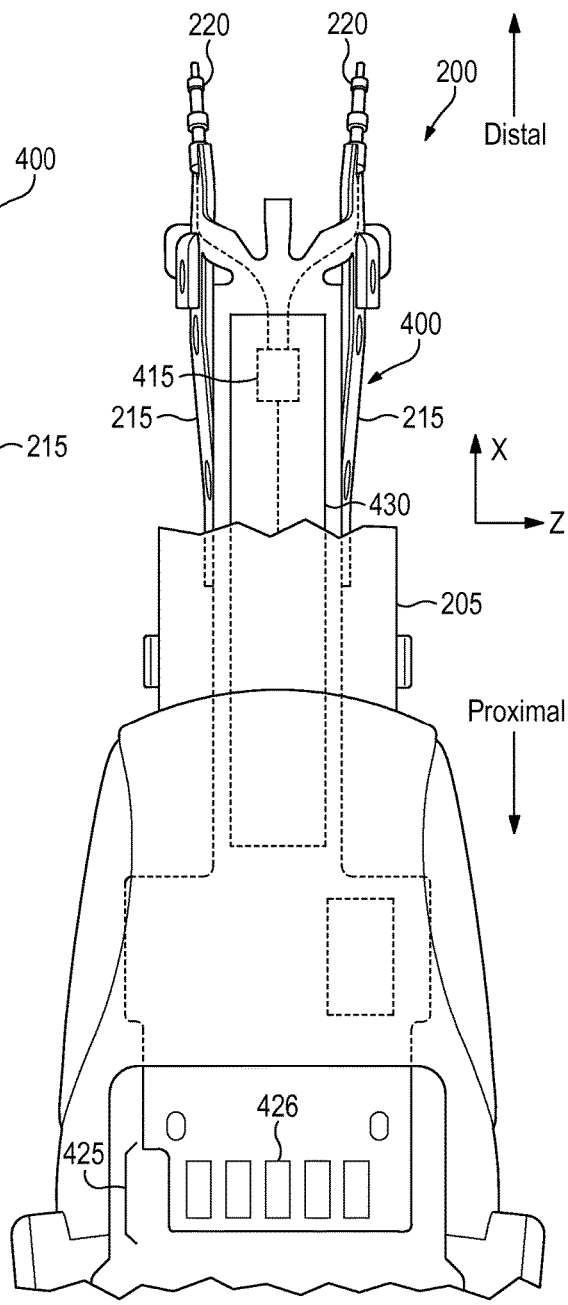
FIG. 4A
FIG. 4B

TEST AND MEASUREMENT PROBE WITH ADJUSTABLE TEST POINT CONTACT

TECHNICAL FIELD

This disclosure relates to test and measurement instruments, and more particularly to probes for test and measurement instruments.

BACKGROUND

Users of test and measurement instruments, such as oscilloscopes, often use probes to connect a device-under-test (DUT), such as a circuit board, to an input of a test and measurement instrument in order to visualize and perform measurements of electrical signals occurring in the DUT. These users are typically engineers designing circuit boards for a wide variety of electronic devices. Consumers of electronic devices generally desire these devices to be as physically small as possible. Accordingly, engineers are often tasked with packing a high quantity of electrical components into a small circuit board area. Additionally, the electrical components themselves are generally designed to be physically smaller with each successive generation. The small size and high density of electrical components in a DUT can make it challenging for engineers to probe test points on a DUT.

Therefore, test and measurement probes must be able to make electrical contact with DUT test points that can be difficult to access, while still providing high bandwidth and good signal fidelity. Test points in a DUT vary considerably in geometry and accessibility. They may reside in a DUT in every angle of orientation from horizontal to vertical. They may be obscured by electrical components. Contemporary high-speed signal busses, such as DDR2, DDR4 and PCIe Gen 4, among others, often use differential signaling, requiring that a probe used to measure these signals must be able to make simultaneous electrical contact with two test points. This may be even more challenging if the two test points are on different planes.

Sometimes a probe may be semi-permanently attached to DUT test points. For example, a "solder-down" type probe may have wires from the probe that are soldered to test points, or that are attached to test points with conductive epoxy. This kind of semi-permanent probe attachment scheme can provide a reliable connection to the DUT. However, solder-down probes also have a number of disadvantages. Due to the often poor accessibility of the DUT test points, the process of soldering probe wires to the DUT can be challenging for a probe user, requiring long set-up times and exceptional dexterity. Further, inconsistencies in the quality of the solder connection can cause high variability in signal fidelity, especially at upper frequencies. Additionally, the small gauge of wire used to attach the probe makes it easy for a user to potentially damage the DUT when soldering the wires in place. In order to probe a different set of test points, a user must unsolder and re-solder the wires—a time-consuming process making this type of probe unsuitable for fast debug environments in which a user may need to quickly check several different DUT test points. Finally, this type of solder-down probe tends to wear out after only a few connections, and can be expensive to replace.

To overcome some of these issues, another style of probe, known as a "browser probe," is designed to be held in a user's hand, or with a holding tool, and be positioned by the user to touch one or more test points in a DUT. This type of browser probe is better suited for debug environments in which maximum probe placement flexibility and minimal measurement setup time are desirable. A browser probe may be designed as a single-ended probe, which measures the electrical signal at one test point in a DUT with respect to a ground, or may be designed as a differential probe, which measures electrical signals at two test points in a DUT and produces an output signal based on the difference between the two measured signals.

SUMMARY OF THE DISCLOSURE

A probe with an adjustable test point contact for making electrical contact with a test point in a device-under-test includes a body, a rigid member, a flexible arm, and a flexible linkage. The rigid member is capable of travelling linearly with respect to the body. The flexible arm has a test point contact disposed at one end, and is fastened to the rigid member at the other end. The flexible linkage is fixed to the body and to the flexible arm. The flexible linkage is structured to cause the flexible arm to bend in response to travel of the rigid member in one direction, and to unbend in response to travel of the rigid member in the other direction.

An adjustable electrical test and measurement probe includes a probe tip body, an articulated test point arm, a linkage bar, and a test point arm positioner. The linkage bar is coupled to the distal end of the probe tip body and is also hinged to the articulated test point arm. The test point arm positioner is hinged to the proximal end of the articulated test point arm, and is moveably coupled to the probe tip body and capable of sliding towards and away from the distal end of the probe tip body. Sliding the test point arm positioner causes the distal end of the articulated test point arm to change position relative to the probe tip body.

An adjustable electrical test and measurement probe includes a body, a test point contact for making electrical contact with a device-under-test test point, and a light source. The test point contact is moveably coupled to the body and is structured so that an angle between the body and the test point contact is user-adjustable. The light source is disposed on a surface. The surface is moveably coupled to the body and is also coupled to the test point contact so that, when the angle between the test point contact and the body is adjusted, the angle between the surface and the body is simultaneously adjusted to keep the light source pointing in substantially the same direction as the test point contact.

BRIEF DESCRIPTION OF THE DRAWINGS

FIG. 4A is a top view of a flexible circuit for use in a probe according to embodiments of the invention.

FIG. 4B is a top partial cutaway view of a probe head with the flexible circuit of FIG. 4A installed, according to embodiments of the invention.

DETAILED DESCRIPTION

Figure 1:
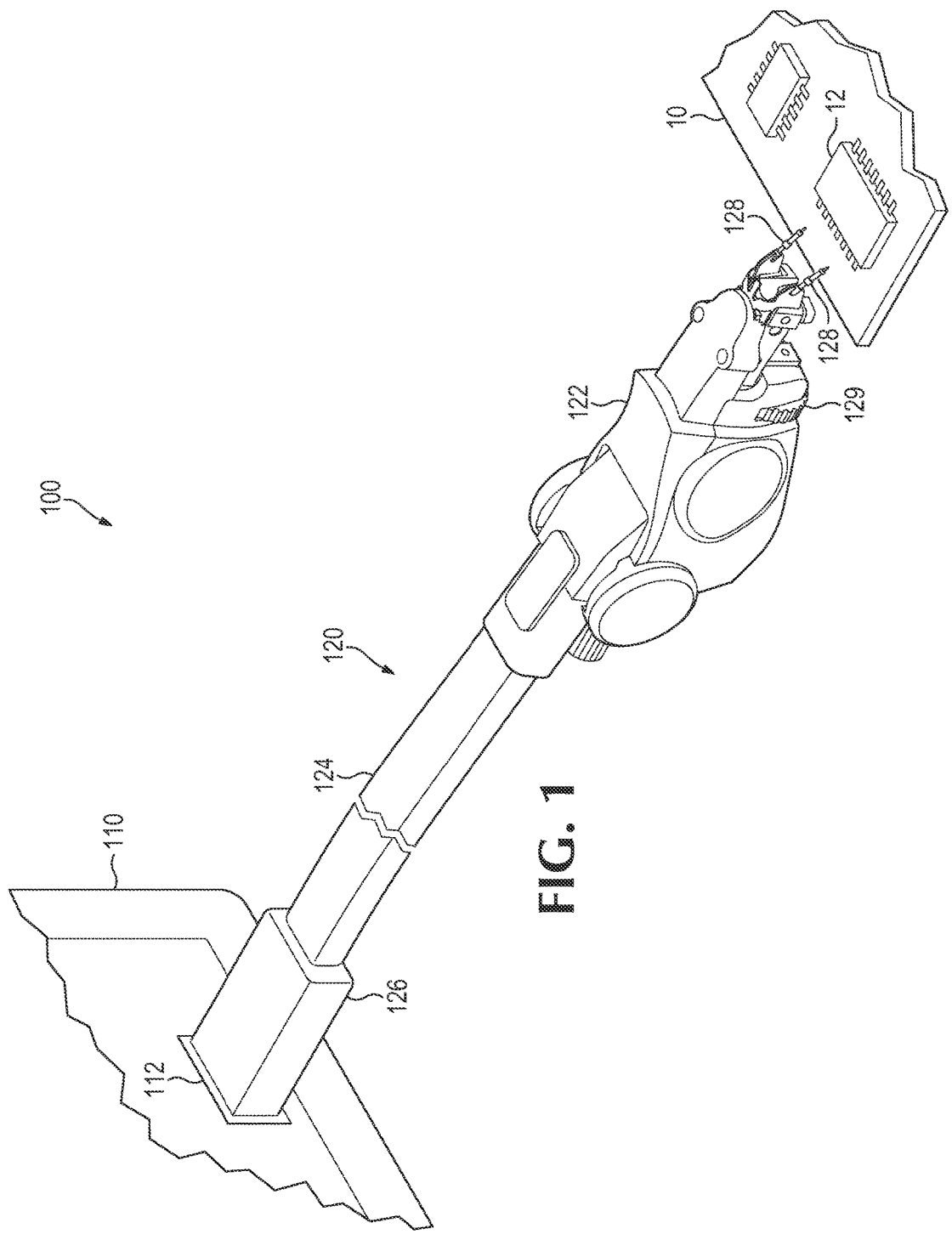
FIG. 1 is a perspective view of an example test and measurement system, including a test and measurement instrument and a test and measurement probe, according to embodiments of the invention.

FIG. 1 depicts an example test and measurement system 100. The test and measurement system 100 includes a test and measurement instrument 110, such as an oscilloscope, as well as a test and measurement probe 120. The test and measurement probe 120 connects to an input 112 of the test and measurement instrument 110. The probe 120 may be used to make electrical contact with one or more test points in a user's device-under-test (DUT) 10, which may be a circuit board. For example, the probe 120 may be positioned by a user to make physical contact with one or more pins on an integrated circuit (IC) 12 placed on the circuit board 10, in order to monitor the electrical signal present at those points in the DUT 10.

The probe 120 generally includes a probe head 122, a probe-to-instrument interface 126, and one or more conductors 124 between the probe head 122 and the probe-to-instrument interface 126. As a browser probe, the probe head 122 is generally dimensioned to be as small as possible for maximum accessibility to test points, but also large enough that it can be comfortably held in a user's grasp. The probe head 122 may alternatively be held by a fixture or a holding tool. The conductors 124 are typically designed as one or more relatively long cables, for example, a high-precision coaxial cable or cable pair, since flexibility of the connection between the instrument 110 and the DUT 10 is typically desirable. However, the conductors 124 may alternatively be designed as a flexible circuit, a rigid circuit board, or another form of interconnect that is suitable for conveying power, control, and data signals between the probe head 122 and the probe-to-instrument interface 126. The probe-to-instrument interface 126 includes a connector that is suitable for connecting to the input 112 of the test and measurement instrument 110, and may also include additional circuitry to provide, for example, signal conditioning, probe control, or probe memory.

According to some embodiments, such as the embodiment illustrated in FIG. 1, the probe 120 is a differential probe. As a differential probe, the probe 120 includes at least two test point contacts 128 in order to make electrical contact with two DUT test points. Typically, the two test point contacts 128 are used to probe pairs of traces, vias, component pins or pads, or connector contacts on the DUT 10. Each pair of DUT test points may have a different amount of space between the two test points, ranging from a spacing of nearly zero inches apart up to approximately 0.200 inches or more apart. To accommodate these test point spacing variations, the probe 120 includes an adjustment mechanism 129 to allow adjustment of the spacing between the test point contacts 128. According to other embodiments, the probe 120 is a single-ended probe. In single-ended embodiments, one test point contact 128 makes electrical contact with a DUT test point, and another test point contact 128 makes electrical contact with a DUT ground.

Figure 2:
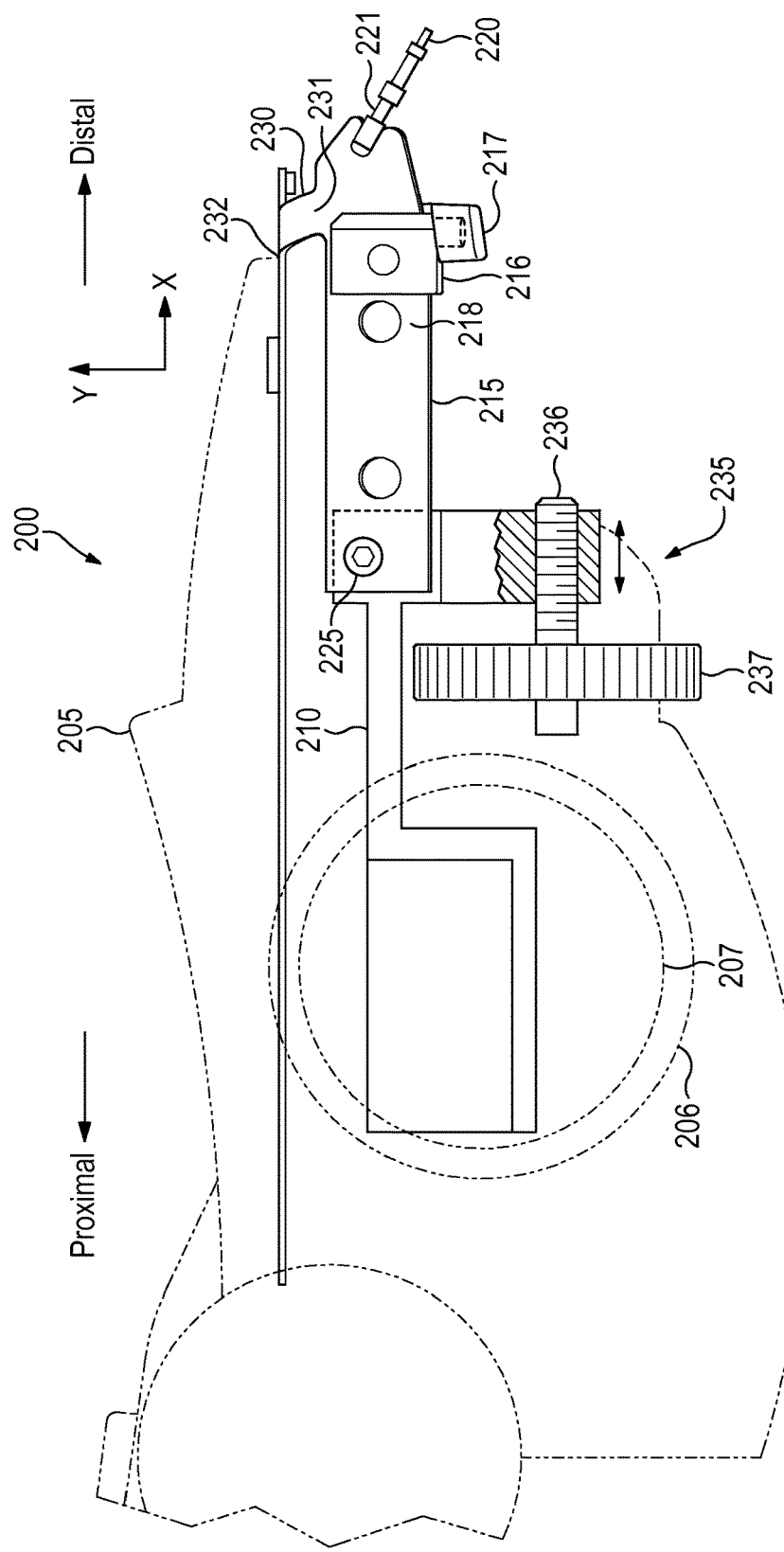
FIG. 2 is a side view of a probe head according to embodiments of the invention.

FIG. 2 is a side view of a probe head 200 according to embodiments of the invention. The probe head 200 includes a body 205 that is dimensioned to be as small as possible, in order to provide good visibility of the DUT to a user, yet still large enough to be comfortably held by the user, for example, by being gripped between the user's thumb and index finger, in order to provide good physical control of the probe head 200. The body 205 may have surface features such as a ridge 206 or a relief 207 to provide an enhanced ergonomic gripping point for the user. In preferred embodiments, the body 205 may be formed out of a lightweight, non-conductive material, such as a molded plastic. Portions of the body 205 are drawn with phantom lines in FIG. 2 so as to more clearly illustrate some internal components of the probe head 200.

The probe head 200 includes a rigid member 210, also called a runner, that is structured to be able to travel linearly with respect to the body 205. For example, the rigid member 210 depicted in FIG. 2 is able to slide forward and backward along the x-axis in relation to the body 205. In some embodiments, the rigid member 210 travels within a channel formed within the body 205, the channel being formed to constrain the movement of the runner 210 to a line along the x-axis, as illustrated in FIG. 2.

In order to make electrical contact with a DUT test point, the probe head 200 includes a flexible arm 215. The flexible arm 215 has a test point contact 220 installed at its distal end. A user will position the probe head 200 so that the test point contact 220 touches a test point of interest in a DUT. In some embodiments, the test point contact 220 comprises a pogo pin. A pogo pin is a well-known type of contact that provides a good electro-mechanical connection with a DUT test point by using a spring-loaded, compressible pin. A pogo pin provides the probe user with tactile feedback that she has made good contact with a DUT test point, allows the user more freedom in the angle at which she holds the probe head 200, and can also accommodate planarity differences between two DUT test points. Furthermore, pogo pins last for hundreds of connection cycles, and are easily replaceable if they do eventually fail. Generally, the pogo pin test point contact 220 is disposed on the distal end of the flexible arm 215 oriented at a downward angle with respect to horizontal in order to allow better reach of the pogo pin test point contact 220 into hard-to-access DUT test points.

Because the pogo pin test point contact 220 is substantially cantilevered off the distal ends of the flexible arm 215, it is desirable that the pogo pin have high mechanical strength. Accordingly, in preferred embodiments, the pogo pin test point contact 220 is constructed at least partially of a high performance ceramic material, such as zirconia, and a high strength metal, such as beryllium copper (BeCu). These materials not only provide mechanical strength, but are also suitable for fabricating a series resistor 221 as part of the pogo pin test point contact 220. As is known, placing a resistor as close as possible to the DUT test point helps to minimize the electrical loading of the DUT circuit that is being probed.

The flexible arm 215 is attached at its proximal end to the rigid member 210. The flexible arms 215 can be attached to the rigid member 210 by a fastener, such as, for example, a screw 225, or by another suitable attachment method, such as, for example, a rivet or an adhesive. Since the proximal end of the flexible arm 215 is fastened to the runner 210, when the runner 210 moves forward along the x-axis, the proximal end of the flexible arms 215 also moves forward along the x-axis, and when the runner 210 moves backward along the x-axis, the proximal end of the flexible arm 215 also moves backward along the x-axis.

However, this forward and backward motion of the flexible arm 215 is constrained by a flexible linkage 230. The flexible linkage 230 connects to the flexible arm 215 at an intermediate point 231 between the proximal end and the distal end of the flexible arm 215. The flexible linkage 230 is also fixed at a point 232 to the body 205. With this structure, the flexible linkage 230 forms a three bar mechanical linkage with the flexible arm 215: one bar being the flexible linkage 230, the second bar being a first portion of the flexible arm 215, and the third bar being a second portion of the flexible arm 215. The flexible linkage 230 acts to keep the distance between the point 231 and the point 232 substantially constant. Therefore, when the runner 210 and the attached proximal end of the flexible arm 215 move forward along the x-axis, having the distance between the points 231, 232 constrained by the flexible linkage 230 causes the flexible arm 215 to buckle and bend at one or more locations. When the flexible arm 215 bends, it exerts a torsional force on the flexible linkage 230 causing the flexible linkage 230 to twist slightly. Conversely, when the runner 210 moves backwards along the x-axis, the flexible arm 215 is caused to unbend back towards a substantially straightened orientation.

In some preferred embodiments, in order to more precisely control the portion of the flexible arm 215 in which this bending occurs, and in order to enhance the repeatability of the bending motion, a stiffener 216 is attached to a portion of the flexible arm 215. The stiffener 216 may be attached to one side of the flexible arm 215, or it may sandwich a portion of the flexible arm 215. To further control the bending motion of the flexible arm 215, and to prevent vertical motion of the flexible arm 215 along the y-axis, the stiffener 216 may optionally be designed to pivot within a support plate 217, which is attached to the body 205. The stiffener 216 thereby acts to constrain the bending of the flexible arm 215 to occur within a particular portion 218 of the flexible arm 215. That is, the stiffener 216 defines an articulation region 218, or hinge region, on the flexible arm 215. The stiffener 216 may also beneficially serve to provide additional mechanical strength to the test point contact 220. In various embodiments of the invention, the combination of the length of the flexible arm 215, the length and shape of the flexible linkage 230, the length and positioning of the stiffener 216, and the travel range of the rigid member 210, may all be selected to set the minimum and maximum range of motion of the flexible arm 215.

To move the rigid member 210 along its linear path of travel, a user operates a linear actuator 235. The linear actuator 235 pushes or pulls on the rigid member 210 to correspondingly move the rigid member 210 forward or backward in relation to the body 205. In some preferred embodiments, the linear actuator 235 comprises a threaded rod 236 that engages with a threaded hole in the rigid member 210, and a thumbwheel 237 that is connected to the threaded rod 236. A user turns the thumbwheel 237 in one direction to cause the rigid member 210 to move forward along the x-axis, thereby bending the flexible arm 215, and turns the thumbwheel 237 in the other direction to cause the rigid member 210 to move backward along the x-axis, thereby unbending the flexible arm 215. In other embodiments, the linear actuator 235 may comprise a slider or lever attached to the rigid member 210 and operated by a user's finger.

In some preferred embodiments, the probe head 200 includes a second, symmetric flexible arm 215. Like the first flexible arm 215, the second flexible arm 215 also has a test point contact 220 disposed at its distal end, and is attached to the rigid member 210 at its proximal end. Likewise, the flexible linkage 230 is also connected to an intermediate point on the second flexible arm between its proximal end and distal end. In these embodiments, which are especially beneficial for differential probing applications, the pair of flexible arms 215 are designed to bend in order to change the spacing between the pair of test point contacts 220 to properly align with a pair of DUT test points. When the rigid member 210 moves forward along the x-axis, the flexible linkage 230 causes the flexible arms 215 to simultaneously buckle and bend inwardly toward each other in a jaw-like, or pincher-like motion, such that the distance between the test point contacts 220 decreases. Conversely, when the rigid member 210 moves backwards along the x-axis, the flexible arms 215 are caused to unbend, or bend away from each other back towards a substantially straightened orientation, such that the distance between the test point contacts 220 increases.

Figure 3A:
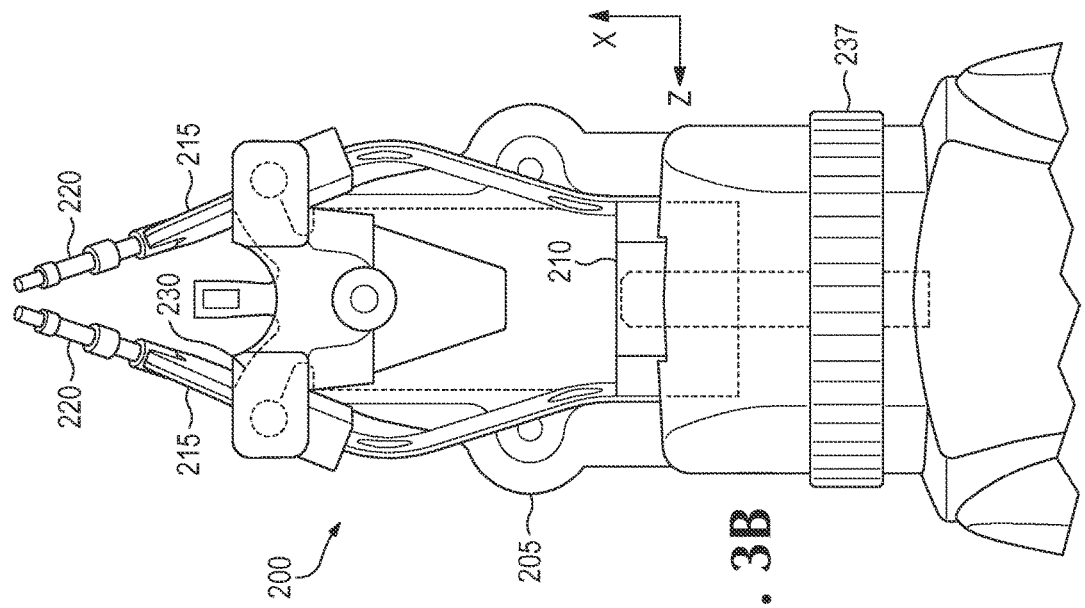
FIG. 3A is a bottom view of a probe head with test point contacts adjusted to a substantially open position, according to embodiments of the invention.
Figure 3B:
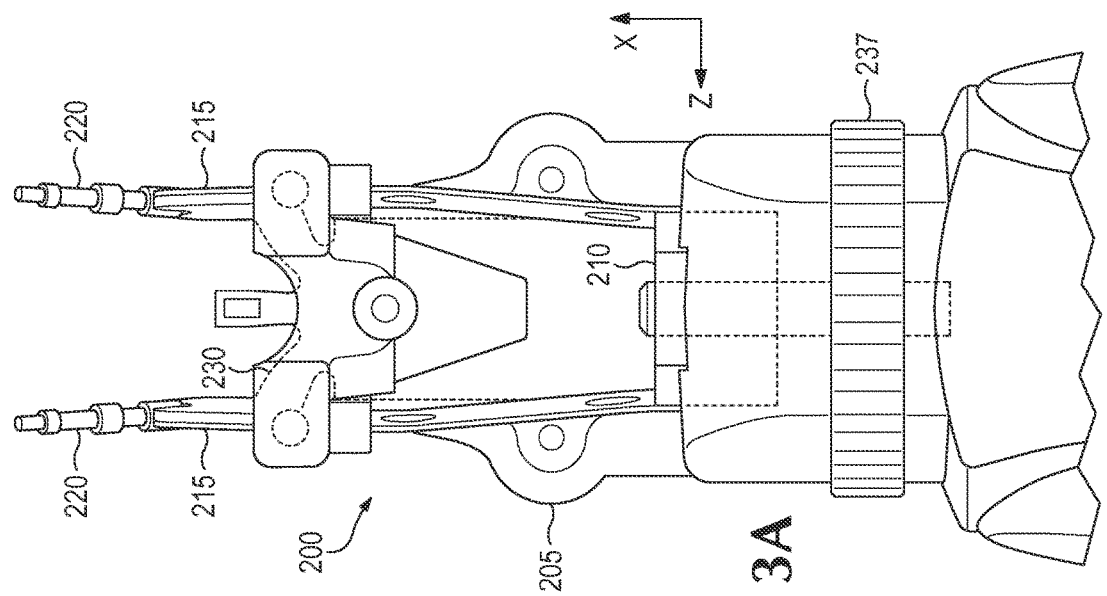
FIG. 3B is a bottom view of a probe head with test point contacts adjusted to a substantially closed position, according to embodiments of the invention.

This pincher-like motion of the pair of flexible arms 215 can be further illustrated by referring to FIGS. 3A and 3B, which are bottom views of the probe head 200 according to embodiments of the invention. FIG. 3A depicts the probe head 200 with the flexible arms 215 in a substantially open position and the test point contacts 220 at their maximum spacing. As shown in FIG. 3A, when the flexible arms 215 are in the substantially open position, the runner 210 is in its most-rearward position against the thumbwheel 237, and the flexible arms 215 are substantially straightened, that is, the flexible arms 215 are substantially parallel to the x-axis. In this position, the test point contacts 220 are spaced to mate with DUT test points that are approximately 0.200 inches apart.

For comparison, FIG. 3B depicts the probe head 200 with the flexible arms 215 in a substantially closed position and the test point contacts 220 at their minimum spacing. As shown in FIG. 3B, when the flexible arms 215 are in the substantially closed position, the runner 210 is in its most-forward position, furthest from the thumbwheel 237, and each of the flexible arms 215 is bent toward the other flexible arm 215. In this position, the test point contacts 220 are spaced to mate with DUT test point contacts that are approximately 0.010 inches apart, although in some embodiments this spacing may be even smaller.

In some embodiments, such as those depicted in FIGS. 3A and 3B, the flexible arms 215 are fabricated from a relatively flat, thin material, such as, for example, a flexible circuit substrate. Thus, when viewed from the bottom side, as in FIGS. 3A and 3B, only the thin edge of the flexible circuit substrate forming the flexible arms 215 is visible. As discussed above, the flexible linkage 230 is structured to form a three bar mechanical linkage with each of the flexible arms 215 so as to constrain the motion of the flexible arms 215 in response to movement of the rigid member 210. That is, by fixing a distance between a point on each flexible arm 215 and the body 205, the flexible linkage 230 causes the flexible arms 215 to bend toward each other in response to forward motion of the rigid member 210.

In some preferred embodiments, in order to reduce manufacturing costs, the flexible arm 215 and the flexible linkage 230 are formed together as a single flexible circuit. FIGS. 4A and 4B illustrate an example of such a flexible circuit 400, including a pair of flexible arms 215, according to embodiments of the invention. The flexible circuit 400 is manufactured using known materials and processes, and can include one or more conductive layers, one or more insulating layers, as well as one or more vias between layers. FIG. 4A depicts the flexible circuit 400 as it would appear if disassembled from the probe head 200 and laid flat. The flexible circuit 400 includes two portions that form the pair of flexible arms 215, as well as a portion that forms the flexible linkage 230. As discussed above with reference to FIG. 2, the flexible linkage 230 portion of the flexible circuit 400 is typically fixed to the body 205 at the point 232, and connects to the flexible arm 215 portions of the flexible circuit 400 at the points 231.

In addition to reducing cost, forming the flexible arms 215 and the flexible linkage 230 as the single flexible circuit 400 is advantageous because the inherent flexibility of the flexible circuit 400 provides the necessary mechanical properties for the articulation, or bending, of the flexible arms 215, while at the same time the flexible circuit 400 can accommodate placement of electrical components and conductive traces to convey electrical signals. For example, according to some embodiments, the flexible circuit 400 includes a portion 410 which contains probe head circuitry, such as, for example, an amplifier 415. A conductive trace 420 is disposed on the flexible circuit 400 to provide an electrical path from one of the test point contacts 220, through the flexible linkage 230 portion of the flexible circuit 400, to an input of the amplifier 415. In some embodiments, the amplifier 415 is a differential amplifier for amplifying the differential signal between the test point contacts 220. The flexible circuit 400 may also include a portion 425 which provides an interface 426 for connecting the probe head 200 to one or more conductors, such as the cable 124 going to the probe-to-instrument interface 126, as discussed above with respect to FIG. 1. Additional traces may be disposed on the flexible circuit 400, such as, for example, a trace 421 that provides an electrical path between an output of the amplifier 415 and the connection interface 426. The flexible circuit 400 may be manufactured to have good electrical transmission properties for conveying the signal from a DUT test point to the connection interface 426.

FIG. 4B is a top view of the probe head 200, with portions of the body 205 shown as partially cut away in order to illustrate how the flexible circuit 400 fits within the body 205, according to embodiments of the invention. When the flexible circuit 400 is assembled into the probe head 200, the flexible arm 215 portions of the flexible circuit 400 are folded down such that their edges are substantially parallel to the x-axis and their top and bottom surfaces are substantially aligned with the x-y plane, and so that the proximal ends of the flexible arms 215 can be fastened to the rigid member 210. The portions 410, 425 of the flexible circuit 400 sit substantially aligned with the x-z plane within the body 205. The amplifier 415, as well as other components and traces that may be disposed on the flexible circuit 400 are generally covered by the body 205, although the connection interface 426 is exposed to allow for easy connection of the one or more conductors 124. A heat sink 430, such as, for example, a strip of aluminum, can also be incorporated into the probe head 200, being installed in such a way as to make contact with the surface of the amplifier 415 in order to dissipate heat generated by the amplifier 415.

Figure 5:
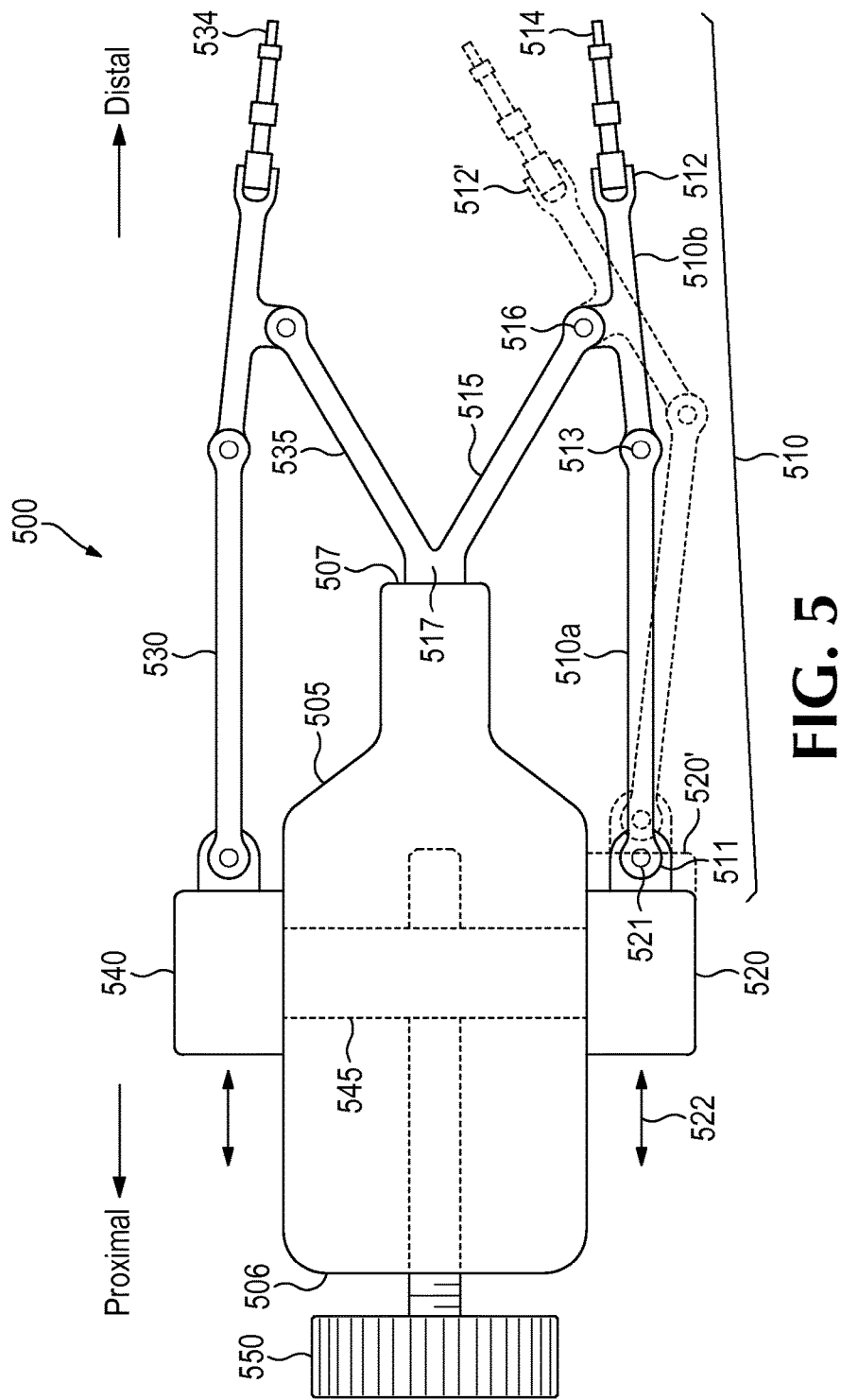
FIG. 5 is a top view of a probe with an articulated test point arm according to embodiments of the invention.

The particular embodiments of the invention discussed above disclose flexible arms 215 that are adjustable by bending and unbending in order to, for example, change the spacing between the test point contacts 220. However, more generally, other embodiments of the invention employ an articulated arm rather than a flexible arm. FIG. 5 is a top view of a probe 500 having an example of such an articulated arm structure. The probe 500 includes a probe tip body 505 having a proximal end 506 and a distal end 507. The probe 500 also includes an articulated test point arm 510 having a proximal end 511 and a distal end 512. The articulated test point arm 510 has at least one articulation point 513, or joint, between the proximal end 511 and the distal end 512, thereby defining a first link 510a, and a second link 510b. The articulated test point arm 510 may have a test point contact 514, such as a pogo pin, disposed at the distal end 512 for making electrical contact with a test point on a DUT. A cable or a wire may run down along or through the articulated test point arm 510 to provide an electrical path from the test point contact 514 to other parts of the probe 500.

A linkage bar 515 is coupled to the distal end 507 of the probe tip body 505, and is also hinged to the second link 510b at a joint 516 between the articulation point 513 and the distal end 512 of the articulated test point arm 510. The coupling 517 between the linkage bar 515 and the probe tip body 505 may either be static, as shown, or may be a moveable joint. The first link 510a, the second link 510b, and the linkage bar 515 form a three-bar mechanical linkage mechanism.

A test point arm positioner 520 is hinged at a joint 521 to the proximal end 511 of the articulated test point arm 510. The test point arm positioner 520 is moveably coupled to the probe tip body 505 and is structured to be able to slide along an axis 522 towards and away from the distal end 507 of the probe tip body 505. With this structure, sliding the test point arm positioner 520 causes a corresponding change in position of the distal end 512 of the articulated test point arm 510. For example, as illustrated by the dashed lines in FIG. 5, when the test point arm positioner 520 is slid forward towards the distal end 507 of the probe tip body 505 into a position 520', the three-bar linkage mechanism causes the articulated test point arm 510 to hinge at the articulation point 513 and causes the distal end 512 of the articulated test point arm 510 to move to a new position 512'. Although the joints 513, 516, 521 are illustrated as simple hinges, they may also be joints that allow movement in three-dimensions, such as, for example, ball joints.

In some embodiments, the probe 500 includes a second articulated test point arm 530 and a second linkage bar 535, which together form a second three-bar linkage mechanism, as well as a second test point arm positioner 540. The second articulated test point arm 530 may also have a test point contact, such as a pogo pin 534, disposed at its distal end. The second test point arm positioner 540 is configured to move the second articulated test point arm 530, similarly to how the first test point arm positioner 520 moves the first articulated test point arm 510. In some embodiments, the first and second test point arm positioners 520, 540 are connected together so that they slide in conjunction. The two test point arm positioners 520, 540 may be connected together by, for example, a connector bar 545. Sliding the two test point arm positioners 520, 540 can be performed by a spacing adjuster 550, which may be, for example, an adjustment screw. By using the spacing adjuster 550 to slide both of the two test point arm positioners 520, 540 forward or backward, a user can adjust the space between the pogo pins 514, 534 to match the spacing between a set of DUT test points.

Figure 6:
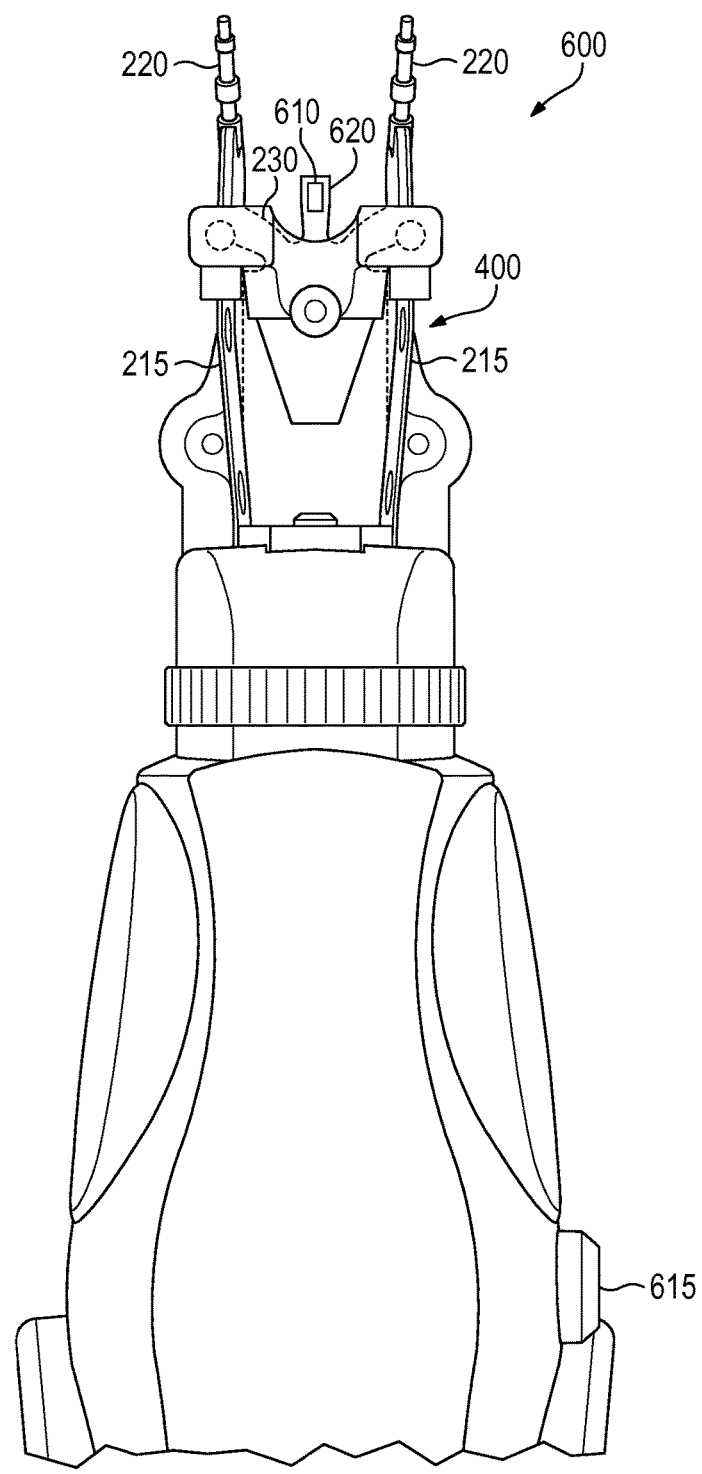
FIG. 6 is a bottom view of a probe head with a light source, according to embodiments of the invention.

The test points on a DUT are often located in areas of the DUT that are difficult to access and dimly lit. Thus, it is often desirable to illuminate the area around the DUT test points. FIG. 6 is a bottom view of a probe head 600 which, according to some embodiments of the invention, includes a light source 610 for illuminating the area around the DUT test points. The probe head 600 utilizes the flexible circuit 400, discussed above with respect to FIG. 4. The light source 610 is disposed on the bottom side of a portion 620 of the flexible linkage 230 portion of the flexible circuit 400. In this location, when the probe head 600 is being used, the light generated by the light source 610 is directed at an area on the DUT surrounding the target DUT test points. In preferred embodiments, the light source 610 comprises a light-emitting diode (LED). Power for the light source 610 may be supplied through the connection interface 426 of the flexible circuit 400. The probe head 600 can also include a switch 615 for switching the light source 610 on and off.

Figure 7A:
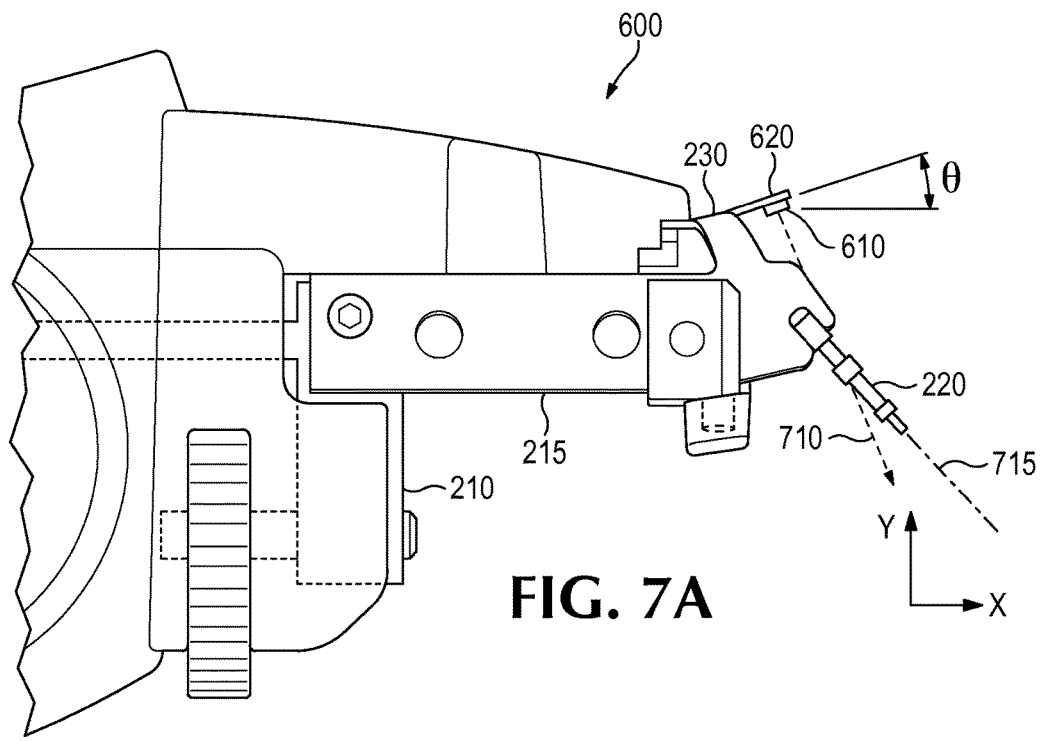
FIGS. 7A and 7B are side views of a frontal part of a probe head with an articulating light source according to embodiments of the invention.
Figure 7B:
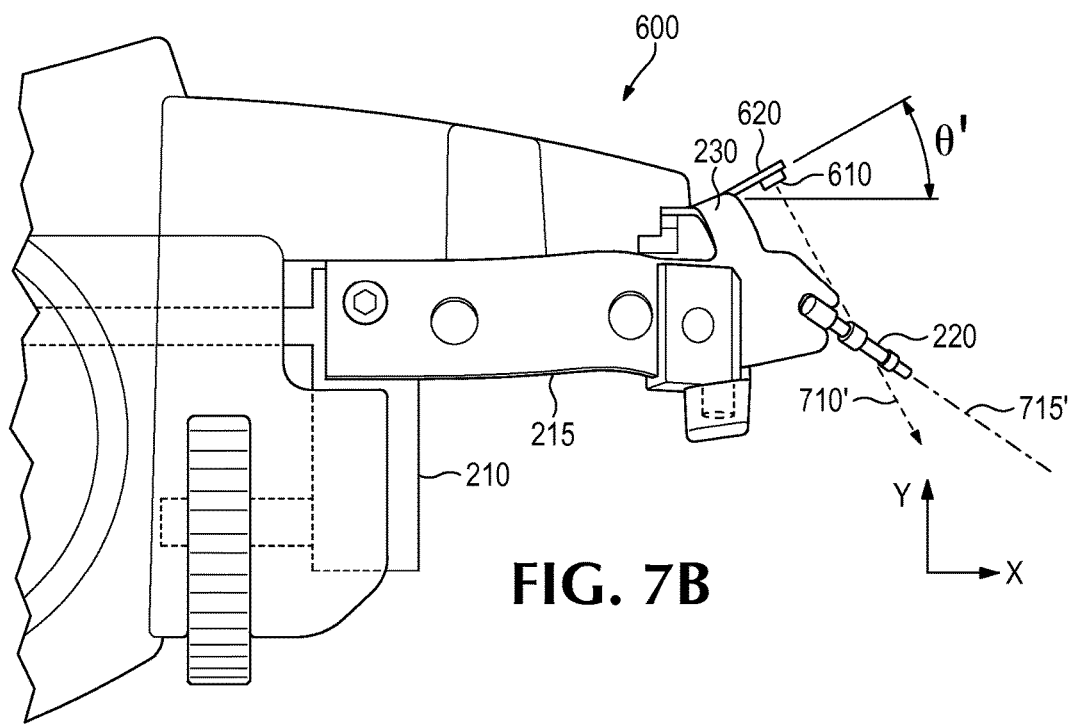

FIGS. 7A and 7B illustrate how, in some embodiments, the light source 610 is disposed on a protruding portion 620 of the flexible linkage 230 that is structured to bend, simultaneously with the bending of the flexible arm 215, in response to motion of the rigid member 210, thereby causing the direction of the light emitted by the light source 610 to automatically track and substantially align with the orientation of the test point contact 220.

For example, FIG. 7A is a side view of a frontal part of the probe head 600 with the flexible arm 215 in a substantially unbent position, corresponding to the runner 210 being in its rearward-most position. In this position, the portion 620 of the flexible linkage 230 is substantially horizontal—that is, the angle θ between the portion 620 and the x-axis is small or approximately zero—and therefore, the direction of the light 710 emitted by the light source 610 is substantially perpendicular to the surface of the portion 620 and is substantially aligned with the orientation 715 of the test point contact 220. When the runner 210 is moved forward to move the flexible arm 215 to a substantially bent position, as depicted in FIG. 7B, the test point contact 220 changes to the orientation 715', due to the bending of the flexible arm 215. The orientation 715' is substantially more horizontal than the orientation 715. Simultaneously, torsional forces created in the flexible linkage 230 due to the movement of the flexible arm 215 cause the portion 620 of the flexible linkage 230 to bend upwards—that is, the angle between the portion 620 and the x-axis increases to the angle θ'—which in turn causes the light emitted by the light source 610 to change to a new direction 710'. If the flexible arm 215 is re-adjusted back towards a substantially unbent position, the portion 620 will tend to relax back towards a horizontal position. In this way, the direction of light 710, 710' from the light source 610 automatically substantially tracks the orientation 715, 715' of the test point contacts 220.

More generally, embodiments of the present invention include an electrical test and measurement probe having a body, at least one test point contact for making electrical contact with a device-under-test (DUT) test point, and a light source. The test point contact is moveably coupled to the probe body in such a way that an angle between the test point contact and the body is adjustable, typically by a user. The light source is disposed on a surface of the probe that is also moveably coupled to the body. The surface is also coupled to the test point contact in such a way that when the angle between the test point contact and the body is adjusted by the user, the surface also automatically adjusts—specifically, by simultaneously changing an angle between the surface and the body—in order to keep the light source pointing in substantially the same direction as the test point contact. In some embodiments, such as those illustrated in FIGS. 7A and 7B and discussed above, the test point contact is moveably coupled to the body by a first portion of a flexible circuit—such as, for example, the flexible arm 215 portion of the flexible circuit 400—and the surface comprises a second portion of the flexible circuit—such as, for example, the portion 620 of the flexible linkage 230 portion of the flexible circuit 400.

Although specific embodiments of the invention have been illustrated and described for purposes of illustration, various modifications may be made without departing from the spirit and scope of the invention. Accordingly, the invention should not be limited except as by the appended claims.

What is claimed is:

1. A probe for making electrical contact with a test point in a device-under-test, the probe comprising:
   a body;
   a rigid member structured to be able to travel linearly with respect to the body;
   a flexible arm having a test point contact disposed at a first end, and fastened at a second end to the rigid member; and
   a flexible linkage fixed to the body and connected to a point on the flexible arm between the first end and the second end, the flexible linkage structured to cause the flexible arm to bend in response to travel of the rigid member in a first direction, and to unbend in response to travel of the rigid member in a second direction, wherein the flexible linkage is substantially nonplanar with the flexible arm.

2. The probe according to claim 1 in which the test point contact comprises a pogo pin.

3. The probe according to claim 2 in which the pogo pin comprises a resistor.

4. The probe according to claim 1, further comprising:
   a stiffener attached to the flexible arm for constraining the bending of the flexible arm to occur within a particular portion of the flexible arm.

5. The probe according to claim 1, further comprising:
   a linear actuator moveably connected to the rigid member for actuating the linear travel of the rigid member.

6. The probe according to claim 5 in which the linear actuator comprises:
   a threaded rod engaging a threaded hole in the rigid member; and
   a thumbwheel fixed to the threaded rod.

7. The probe according to claim 1, further comprising:
   a second flexible arm having a second test point contact disposed at a first end, and fastened at a second end to the rigid member,
   in which the flexible linkage is also connected to a point on the second flexible arm between the first end and the second end, the flexible linkage structured to cause the first and second test point contacts to simultaneously move towards each other in response to travel of the rigid member in the first direction, and to simultaneously move away from each other in response to travel of the rigid member in the second direction.

8. The probe according to claim 1 in which the flexible arm and the flexible linkage are formed as a single flexible circuit.

9. The probe according to claim 8, further comprising:
   an amplifier disposed on the flexible circuit; and
   a conductive trace disposed on the flexible circuit, providing an electrical path from the test point contact to an input of the amplifier.

10. The probe according to claim 1, further comprising:
    a light source for illuminating an area on the device-under-test surrounding the test point.

11. The probe according to claim 10 in which the light source comprises a light-emitting diode.

12. The probe according to claim 10, further comprising:
    a switch for switching the light source on and off.

13. The probe according to claim 10 in which the light source is disposed on a portion of the flexible linkage structured to bend simultaneously with the bending of the flexible arm so that the direction of light from the light source automatically substantially tracks the orientation of the test point contact.

* * * * *